United States Patent

Chapman et al.

[11] Patent Number: 5,959,339
[45] Date of Patent: Sep. 28, 1999

[54] SIMULTANEOUS TWO-WAVELENGTH P-N-P-N INFRARED DETECTOR

[75] Inventors: George R. Chapman, Santa Barbara; Kenneth Kosai, Goleta, both of Calif.

[73] Assignee: Raytheon Company, Lexington, Mass.

[21] Appl. No.: 08/620,718

[22] Filed: Mar. 19, 1996

[51] Int. Cl.[6] .............................. G01J 1/02; G01T 1/24; H01L 31/00
[52] U.S. Cl. .................. 257/440; 257/442; 257/443; 257/460; 257/466; 250/370.01; 250/370.08
[58] Field of Search .................... 257/440, 442, 257/443, 460, 462, 466; 250/370.01, 370.08

[56] References Cited

U.S. PATENT DOCUMENTS

| | | | |
|---|---|---|---|
| 4,582,952 | 4/1986 | McNeely et al. | 136/249 |
| 4,753,684 | 6/1988 | Ondris et al. | 136/258 |
| 4,847,489 | 7/1989 | Dietrich | 250/226 |
| 5,113,076 | 5/1992 | Schulte | 250/370.06 |
| 5,149,956 | 9/1992 | Norton | 250/211 |
| 5,380,669 | 1/1995 | Norton | 437/5 |
| 5,457,331 | 10/1995 | Kosai et al. | 257/188 |
| 5,479,032 | 12/1995 | Forrest et al. | 257/190 |
| 5,559,336 | 9/1996 | Kosai et al. | 250/370.13 |

FOREIGN PATENT DOCUMENTS

| | | |
|---|---|---|
| 55-101832 | 8/1980 | Japan . |
| 2 255 227 | 10/1992 | United Kingdom . |

OTHER PUBLICATIONS

"Infinite–Melt Vertical Liquid–Phase Epitaxy of HgCdTe From Hg Solution: Status and Prospects", Journal of Crystal Growth 86 (1988) 161–172, North–Holland, Amsterdam.
"Some Properties of Photovoltaic $Cd_xHg_{1-x}Te$ Detectors for Infrared Radiation", J.M. Pawlikowski and P. Becla, Jan. 1975.
"HgCdTe dual–band infrared photodiodes grown by molecular beam epitaxy", J.M. Arias, M. Zandian, G. M. Williams, E.R. Blazejewski, R.E. DeWames, and J.G. Pasko, J. Appl. Phys. 70(8), Oct. 15, 1991.

*Primary Examiner*—Mahshid D. Saadat
*Assistant Examiner*—Allan R. Wilson
*Attorney, Agent, or Firm*—William C. Schubert; Glenn H. Lenzen, Jr.

[57] ABSTRACT

An array (41) is comprised of a plurality of radiation detectors (10, 10') each of which includes a first photoresponsive diode (D1) having an anode and a cathode that is coupled to an anode of a second photoresponsive diode (D2). The first photoresponsive diode responds to electromagnetic radiation within a first band of wavelengths and the second photoresponsive diode responds to electromagnetic radiation within a second band of wavelengths. Each radiation detector further includes a first electrical contact (26) that is conductively coupled to the anode of the first photoresponsive diode; a second electrical contact (28) that is conductively coupled to the cathode of the first photoresponsive diode and to the anode of the second photoresponsive diode; and a third electrical contact (30) that is conductively coupled to a cathode of each second photoresponsive diode of the array. The electrical contacts are coupled during operation to respective bias potentials. The first electrical contact conducts a first electrical current induced by electromagnetic radiation within the first predetermined band of wavelengths, and the second electrical contact conducts a second electrical current induced by electromagnetic radiation within the second predetermined band of wavelengths less an electrical current induced by electromagnetic radiation within the first predetermined band of wavelengths.

12 Claims, 5 Drawing Sheets

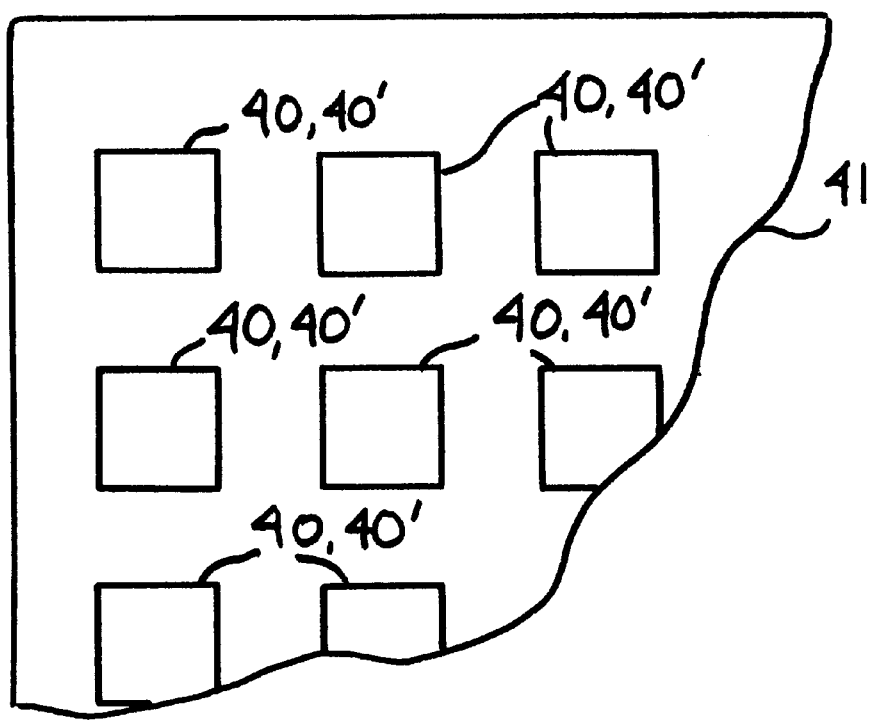

SIMULTANEOUS TWO-WAVELENGTH P-N-P-N INFRARED DETECTOR

FIELD OF THE INVENTION

This invention relates generally to solid state radiation detectors and, in particular, to radiation detectors that are sensitive to radiation within a plurality of spectral bands or "colors".

BACKGROUND OF THE INVENTION

A desirable type of photodetector is a two-color infrared radiation (IR) detector having simultaneous sensitivity in two spectral bands. The spectral bands may include short wavelength IR (SWIR), medium wavelength IR (MWIR), long wavelength IR (LWIR), and very long wavelength IR (VLWIR). An array of two-color IR detectors may be employed in a number of imaging applications wherein it is required to simultaneously detect radiation within two spectral bands from a scene within a field of view of the array. By example, the array may simultaneously detect LWIR and MWIR, or LWIR and SWIR.

FIG. 1 illustrates a two-color detector of type similar to that disclosed in commonly assigned U.S. Pat. No. 5,113,076, issued May 12, 1992, entitled "Two Terminal Multiband Infrared Radiation Detector" to E. F. Schulte. This commonly assigned patent discloses a radiation detector having two heterojunctions that function in a manner analogous to two back-to-back photodiodes. Each of the photodiodes is responsive to radiation within a different IR spectral band, such as LWIR and MWIR. Detection of a particular wavelength band is achieved by switching a bias supply. Disclosed configurations include an n-p-n configuration, a p-n-p configuration, and a p-n-p-n configuration.

Reference is also made to commonly assigned U.S. Pat. No. 5,149,956, issued Sep. 22, 1992, entitled "Two-Color Radiation Detector Array and Methods of Fabricating Same", by P. R. Norton. This patent describes the formation of a substantially continuous common layer between semiconductor regions responsive to different wavelength bands (e.g., MWIR and LWIR). A contact 28 is made to the common layer for coupling same to readout electronics.

Reference is also made to commonly assigned U.S. Pat. No. 5,380,669, issued Jan. 10, 1995, entitled "Method of Fabricating a Two-Color Radiation Detector Using LPE Crystal Growth", by P. R. Norton. This patent describes the use of Liquid Phase Epitaxy (LPE) to grow an n-type LWIR layer, a p-type MWIR layer, and an n-type MWIR layer on a sacrificial substrate. A passivation layer is then formed over the n-type MWIR layer, an IR transparent substrate is bonded to the passivation layer, and the sacrificial substrate is then removed. The resulting structure is then further processed to form an array of two-color detectors.

Also of interest is commonly assigned U.S. Pat. No. 5,457,331, issued Oct. 10, 1995, entitled "Dual-Band Infrared Radiation Detector Optimized for Fabrication in Compositionally Graded HgCdTe", by K. Kosai and G. Chapman (the inventors of the subject matter of this patent application).

Reference can also be made to the n-p+-n dual-band detector described by J. M. Arias et al. in the Journal of Applied Physics, 70(8), Oct. 15, 1991, pps. 4820–4822. In this triple-layer n-p$^+$-n structure MWIR absorption occurs in the bottom n-type layer, and LWIR absorption occurs in the top n-type layer.

In U.S. Pat. No. 4,847,489, Jul. 11, 1989, entitled "Light Sensitive Superlattice Detector Arrangement with Spectral Sensitivity" Dietrich discloses a detector arrangement comprising a plurality of photosensitive detector elements. Each of the detector elements has a multilayer structure of alternating positively and negatively doped photosensitive semiconductor material having a superlattice structure. A control voltage is said to control spectral light sensitivity, and an optical filter arrangement is provided for dividing the photodetectors into an upper and lower effective spectral range group.

In U.S. Pat. No. 4,753,684, Jun. 28, 1988, "Photovoltaic Heterojunction Structures" Ondris et al. describe a three layer, double heterojunction Group II–VI photovoltaic structure.

In Japanese Pat. No. 55-101832, Aug. 4, 1980, Makoto Itou discloses, in the Abstract, an infrared detector comprised of n-type HgCdTe having electrodes 2 and 3 arranged on opposite surfaces. A polarity of a bias voltage is switchably coupled to the electrodes 2 and 3. This device is said to enable rays of wide wavelength ranges to be detected by only one semiconductor detector.

General information regarding IR-responsive materials may be found in an article entitled "HgCdTe and Related Alloys", D. Long and J. L. Schmit, Semiconductors and Semimetals, Vol. 5, IR Detectors, Academic Press 1970.

An article entitled "Some Properties of Photovoltaic $Cd_xHg_{1-x}$ Te Detectors for Infrared Radiation", by J. M. Pawlikowski and P. Becla, Infrared Physics, Vol. 15 (1975) pp. 331–337 describes photovoltaic p-n junction detectors constructed of HgCdTe crystals and epitaxial films. The authors report that the position of a photosensitivity maximum is shifted within a spectral region of 1–9 microns by changing a molar fraction of cadmium.

SUMMARY OF THE INVENTION

It is an object of this invention to provide an improved two-color IR detector and an array comprised of same.

It is another object of this invention to provide a two-color simultaneous IR detector array having a four layered structure (n-type MWIR/p$^+$-type SWIR/n-type LWIR with a p$^+$-type LWIR capping layer) that employs, within each pixel, a direct middle layer (p$^+$ SWIR) contact.

It is a further object of this invention to provide a two-color simultaneous IR detector array having a four layered structure (n-type MWIR/p$^+$-type SWIR/n-type LWIR with a p$^+$-type LWIR capping layer) that employs, within each pixel, an indirect middle layer (p$^+$ SWIR) contact through an n-type LWIR/p$^+$ SWIR forward biased diode.

It is one further object of this invention to provide a bias-selectable two-color or one color (e.g., MWIR/LWIR or LWIR) radiation detector array.

The foregoing objects of the invention are realized by an array comprised of a plurality of radiation detectors, and by a method for fabricating the array. In a presently preferred embodiment individual ones of the radiation detectors include a first layer comprised of Group II–VI semiconductor material. The first layer has a first type of electrical conductivity and a bandgap selected for absorbing radiation within a first spectral band. The radiation detectors also each include a second layer overlying the first layer. The second layer is comprised of Group II–VI semiconductor material and has a second type of electrical conductivity that is opposite the first type of electrical conductivity. The second layer forms a first p-n junction with the first layer. Each radiation detector further includes a third layer overlying the second layer, the third layer also being comprised of Group II–VI semiconductor material. The third layer has the first type of electrical conductivity and a bandgap selected for absorbing radiation within a second spectral band. Each radiation detector further includes a fourth layer overlying the third layer, the fourth layer also being comprised of Group II–VI semiconductor material. The fourth layer has the second type of electrical conductivity and forms a second p-n junction with the third layer. The first and second spectral bands are selected from the group consisting essentially of SWIR, MWIR, LWIR, and VLWIR.

The second and third layers are conductively coupled together in a first embodiment of the invention (a direct contact embodiment) with an ohmic connection made through an aperture within the third layer. The second and third layers are also coupled to a bias supply that, in combination with another bias supply, reverse biases both the first and second p-n junctions enabling simultaneous collection of MWIR and LWIR-induced photocarriers.

In a second embodiment of the invention (an indirect contact embodiment) the second and third layers are conductively coupled together through a third p-n junction. The second and third layers are also coupled to a bias supply that, in combination with another bias supply, forward biases the third p-n junction while reverse biasing both the first and second p-n junctions, thus enabling the simultaneous collection of MWIR and LWIR-induced photocarriers. In this embodiment of the invention an adjustment of the bias supplies results in only the LWIR-induced photocarriers being collected by a combination of the second and third p-n junctions.

The array of radiation detectors further includes a substrate having a first surface underlying a surface of the first layer. The substrate is selected from a material that is substantially transparent to electromagnetic radiation within the first and the second spectral bands.

This invention thus teaches an array comprised of a plurality of radiation detectors. Individual ones of the radiation detectors include a first photoresponsive diode having an anode and a cathode that is coupled to an anode of a second photoresponsive diode. The first photoresponsive diode is responsive to electromagnetic radiation within a first predetermined band of wavelengths and the second photoresponsive diode is responsive to electromagnetic radiation within a second predetermined band of wavelengths. Each radiation detector further includes a first electrical contact that is conductively coupled to the anode of the first photoresponsive diode; a second electrical contact that is conductively coupled to the cathode of the first photoresponsive diode and to the anode of the second photoresponsive diode; and a third electrical contact that is conductively coupled to a cathode of each second photoresponsive diode of the array. The first, second and third electrical contacts are coupled during operation of the array to first, second and third potentials, respectively. The first electrical contact conducts a first electrical current induced by electromagnetic radiation within the first predetermined band of wavelengths, and the second electrical contact conducts a second electrical current induced by electromagnetic radiation within the second predetermined band of wavelengths, less an electrical current induced by electromagnetic radiation within the first predetermined band of wavelengths.

In the indirect contact embodiment of this invention, and for first values of the first, second and third potentials, the first electrical contact conducts a first electrical current induced by electromagnetic radiation within the first predetermined band of wavelengths and the second electrical contact conducts a second electrical current induced by electromagnetic radiation within the second predetermined band of wavelengths less an electrical current induced by electromagnetic radiation within the first predetermined band of wavelengths. For second values of the first, second and third potentials the first electrical contact conducts the first electrical current induced by electromagnetic radiation within the first predetermined band of wavelengths, and the second electrical contact conducts an electrical current induced by electromagnetic radiation only within the first predetermined band of wavelengths.

BRIEF DESCRIPTION OF THE DRAWINGS

The above set forth and other features of the invention are made more apparent in the ensuing Detailed Description of the Invention, when read in conjunction with the attached Drawings, wherein:

FIG. 9 is a simplified top view of a portion of an array of IR detectors.

DETAILED DESCRIPTION OF THE INVENTION

The disclosures of the above-referenced commonly assigned U.S. Pat. Nos. 5,113,076, 5,149,956, 5,380,669 and 5,457,331 are incorporated by reference herein in their entireties, in so far as they do not conflict with the teaching of this invention.

As employed herein Short Wavelength Infrared (SWIR) radiation is considered to include a spectral region extending from approximately 1000 nanometers (nm) to approximately 3000 nm. Medium Wavelength Infrared (MWIR) radiation is considered to include a spectral region extending from approximately 3000 nm to approximately 8000 nm. Long Wavelength Infrared (LWIR) radiation is considered to include a spectral region extending from approximately 7000 nm to approximately 14000 nm. Very Long Wavelength Infrared (VLWIR) radiation is considered to include a spectral region extending from approximately 12000 nm to approximately 30000 nm. Although the bands overlap to some extent, for the purposes disclosed herein the overlap is not considered to be significant. Also, as employed herein a semiconductor material is considered to exhibit significant responsivity to a given spectral band if the semiconductor material exhibits a maximum or substantially maximum photosensitivity to wavelengths within the given spectral band.

The radiation detectors disclosed herein are preferably fabricated by LPE. Suitable LPE growth techniques are described in the following two articles: T. Tung, M. H. Kalisher, A. P. Stevens and P. E. Herning, in: Materials for Infrared Detectors and Sources, Mater. Res. Soc. Symp. Proc., Vol. 90 (Mater. Res. Soc., Pittsburgh, Pa., 1987), p.321; and T. Tung, Infinite-Melt Vertical Liquid-Phase Epitaxy of HgCdTe from Hg Solution: Status and Prospects, J. Crystal Growth 86 (1988), pps. 161–172.

Figure 2:
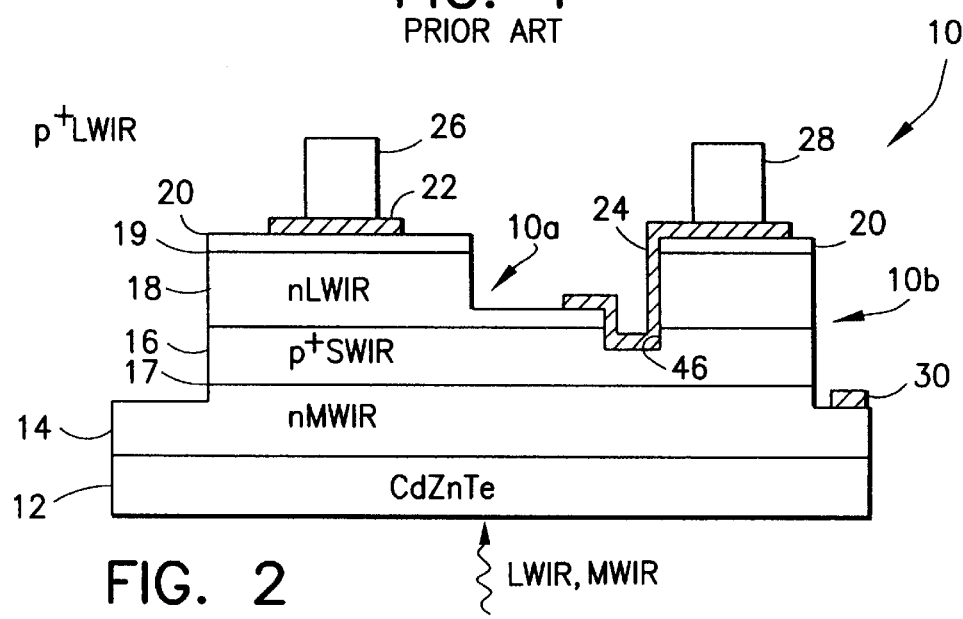
FIG. 2 is a cross-sectional view, not to scale, of a two-color simultaneous IR detector array having, in accordance with a first embodiment of this invention, a four layered structure (n-type MWIR/p$^+$-type SWIR/n-type LWIR with a p$^+$-type LWIR capping layer) that employs, within each pixel, a direct middle layer (SWIR) contact.
Figure 7:
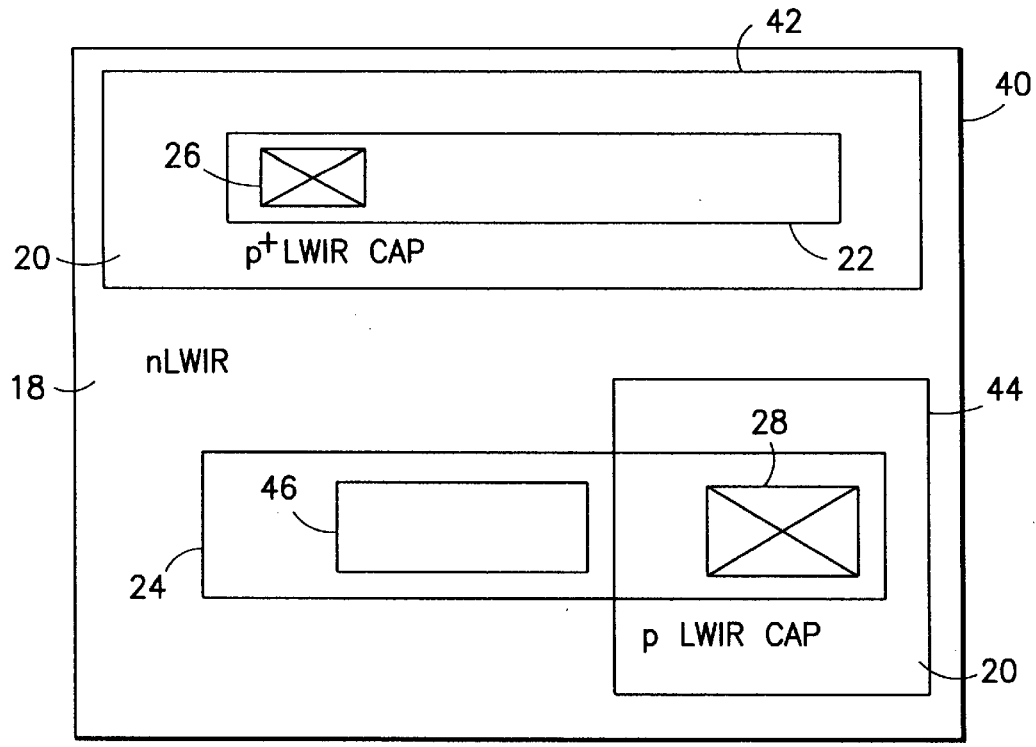
FIG. 7 is an enlarged plan view of the two-color direct contact detector of FIG. 2.

Reference is now made to FIGS. 2 and 7 for showing a first embodiment of a two-color IR responsive radiation detector 10 in accordance with this invention. A detector array 44, as in FIG. 9, is comprised of a plurality of such photodetectors, each of which defines a detector site or pixel having, by example, a 50 micrometer pitch.

The detector 10 is formed over a transparent (at wavelengths of interest) substrate 12, e.g., a CdZnTe substrate. Over a surface of the substrate 12 is grown an n-type MWIR responsive radiation absorbing layer 14. Layer 14 has a thickness of approximately 11 micrometers and is doped n-type with, by example, indium at a concentration of approximately $3 \times 10^{15}$ atoms/cm$^3$. Overlying the first layer 14 is a p$^+$ SWIR second layer 16. Layer 16 has a thickness of approximately 3.5 micrometers and is doped p-type with, by example, arsenic. Overlying the second layer 16 is an n-type LWIR responsive radiation absorbing layer 18. Layer 18 has a thickness of approximately 8.5 micrometers and is doped n-type with, by example, indium at a concentration of approximately $3 \times 10^{15}$ atoms/cm$^3$. Overlying the third layer 18 is a p$^+$ cap layer 20. Layer 20 has a thickness of less than approximately 3.5 micrometers and is doped p-type with, by example, arsenic.

It is pointed out the foregoing layer thicknesses, dopant types, and dopant concentrations are exemplary, and are not to be construed in a limiting sense upon the practice of the teaching of this invention.

In the embodiment of FIGS. 2 and 7 the layers 14, 16, 18 and 20 are differentiated with orthogonally disposed trenches to form a plurality of mesa structures 10a and 10b. The optically active volume of the detector 10 is comprised primarily of the mesa structure 10a. The mesa structure 10a has a top surface 42 and downwardly sloping sidewalls that terminate in the MWIR layer 14 and within the LWIR layer 18. Contact metal 22 and an indium bump 26 are provided for coupling the mesa 10a to external biasing and read-out electronics (shown in FIG. 6a). The n-type MWIR layer 14 is a common layer to all of the detectors of the array, and is provided with an electrical contact 30 positioned at a perimeter of the array.

The mesa structure 10b has a top surface 44 and downwardly sloping sidewalls that terminate in the SWIR layer 16 and the MWIR layer 14. In accordance with an aspect of this invention, contact metal 24 is provided for shorting the n-type LWIR layer 18 to the p-type SWIR layer 16. An indium bump 28 provides a connection to an externally applied bias potential.

The indium bumps 24 and 28 enable the array to be subsequently hybridized with an associated readout integrated circuit, and are cold welded to corresponding indium bumps on a surface of the readout integrated circuit. Techniques for hybridizing radiation detector arrays to readout integrated circuits are known in the art.

An electrically insulating dielectric layer, preferably a wide-bandgap passivation layer, such as a layer of CdTe, can be applied over exposed surfaces of the mesa structures 10a and 10b. The passivation layer beneficially reduces surface states and improves the signal-to-noise ratio of the detector 10. A suitable thickness for the passivation layer, when comprised of CdTe, is approximately 5000 Å.

Figure 1:
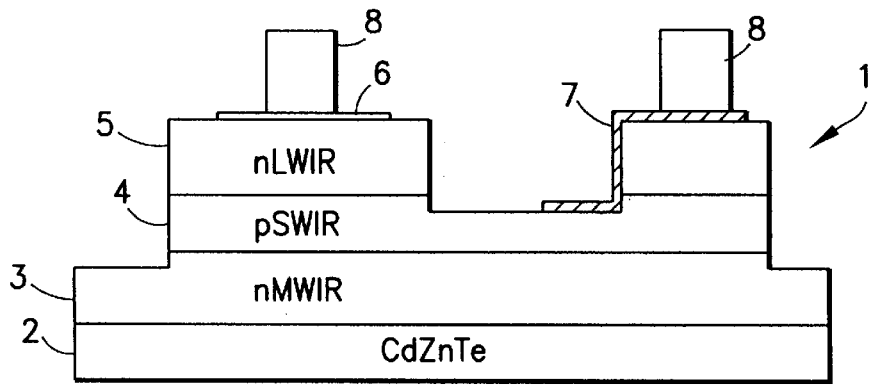
FIG. 1 is a cross-sectional view, not to scale, of a prior art dual-band (two-color) IR detector.
Figure 4:
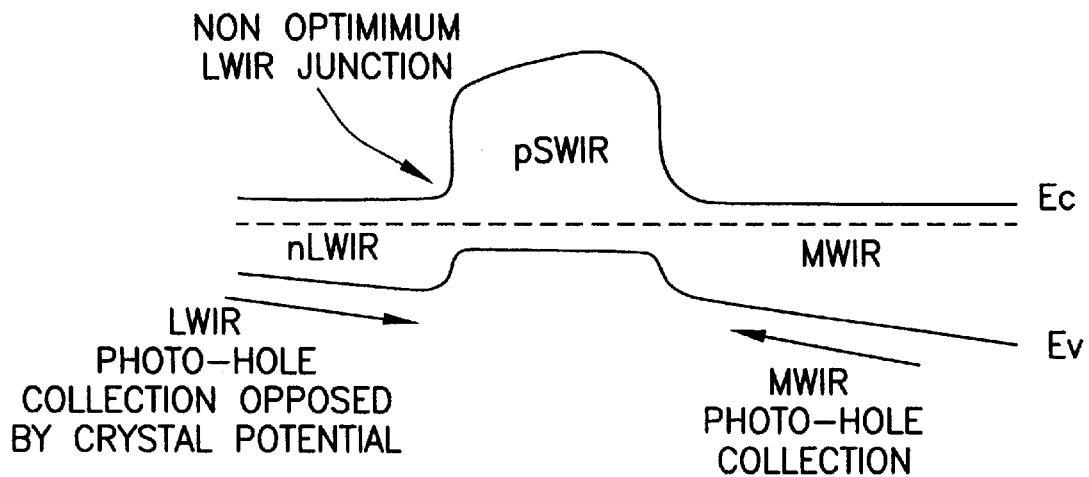
FIG. 4 is an idealized energy band structure for the conventional two-color detector of FIG. 1.

Referring to FIG. 4, the inherent compositional grading of the LPE-grown LWIR layer 5 of FIG. 1 may create a crystal potential that repels photo-holes (photocarriers) away from the p$^+$/n junction between layers 4 and 5. This can result in very soft LWIR spectral cutoffs for both sequential and simultaneous detectors made from this material.

Figure 5:
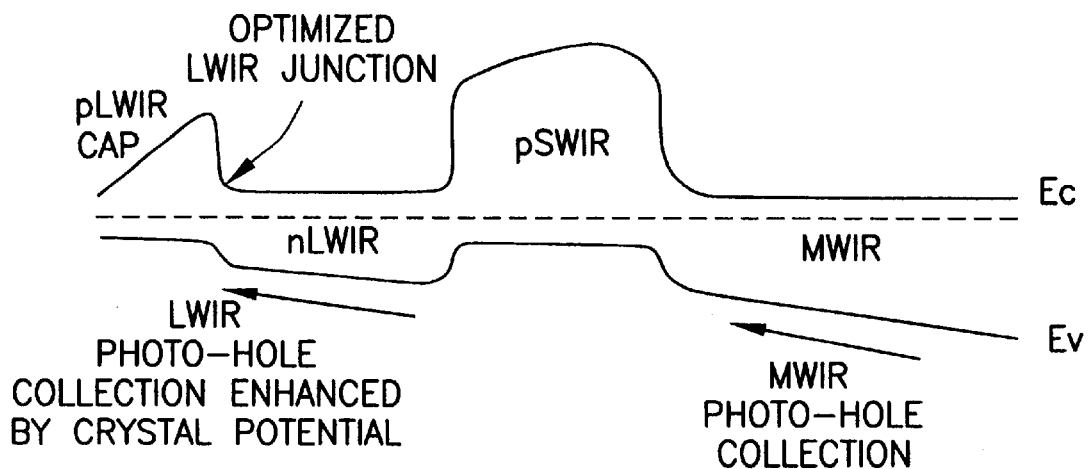
FIG. 5 is an idealized energy band structure for the two-color detector of FIGS. 2 and 3.

For the detector 10 of FIG. 2 the MWIR and LWIR p+/n junctions 17 and 19, respectively, are optimized for charge carrier collection. Referring to FIG. 5, the inherent compositional grading of the LWIR layer 18, in combination with the p$^+$ LWIR cap layer 20, aids in the collection of LWIR photo-holes, as opposed to impeding their collection as in the energy band diagram of FIG. 4.

In the detector 10 the LWIR junction 19 is between the top p$^+$ LWIR cap layer 19 and the n-type LWIR layer 18, and not between the middle p$^+$ SWIR layer 16 and the n-type LWIR layer 18 as in the detector 1 of FIG. 1. As such, a mechanism is provided to electrically couple or short the n-type LWIR layer 18 to the p+ SWIR layer 16. If these layers are not shorted together an undesirable additional indium bump is instead required in each unit cell to allow separate access to each of these layers. The additional indium bump would complicate the fabrication of the detector, and may also increase the area of the unit cell. As such, and as is illustrated in FIG. 2, it is preferred for this direct contact embodiment to short the n-type LWIR layer 18 to the p+ SWIR layer 16 using the metalization 24.

FIG. 7 shows a plan view of the direct contact detector 10. The unit cell or pixel boundary is designated as 40. The top of the LWIR mesa boa is designated as 42, the top of the mesa 10b is designated as 44, and an aperture through the n-type LWIR layer 18 to expose the p$^+$ SWIR layer 16 is designated as 46.

Figure 6A:
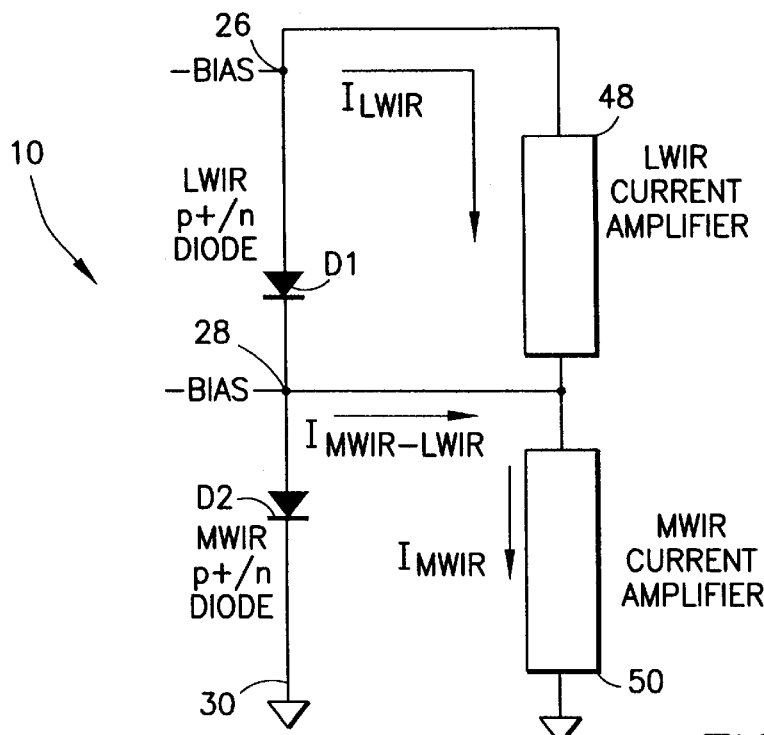
FIG. 6a is a schematic diagram for the n-type MWIR/p$^+$-type SWIR/n-type LWIR/p$^+$-type LWIR capping layer direct contact detector of FIG. 2.

FIG. 6a shows a schematic representation of the two-color detector 10 and the associated readout unit cell. The readout unit cell includes an LWIR current amplifier 48 and a MWIR current amplifier 50. In FIG. 6a it can be seen that the current directions for the LWIR and MWIR series coupled diode detectors D1 and D2, respectively, are in the same direction; that biases applied to the two unit cell contacts (indium bumps 26 and 28) are both negative with respect to the substrate 12 (the contact 30); and that the middle layer contact (indium bump 28) conducts a current that is a difference between the MWIR and LWIR photo-currents. Referring also to FIG. 2, suitable bias potentials are zero volts for contact 30, −50 mV for middle layer contact 28, and −100 mV for cap layer contact 26.

Figure 3:
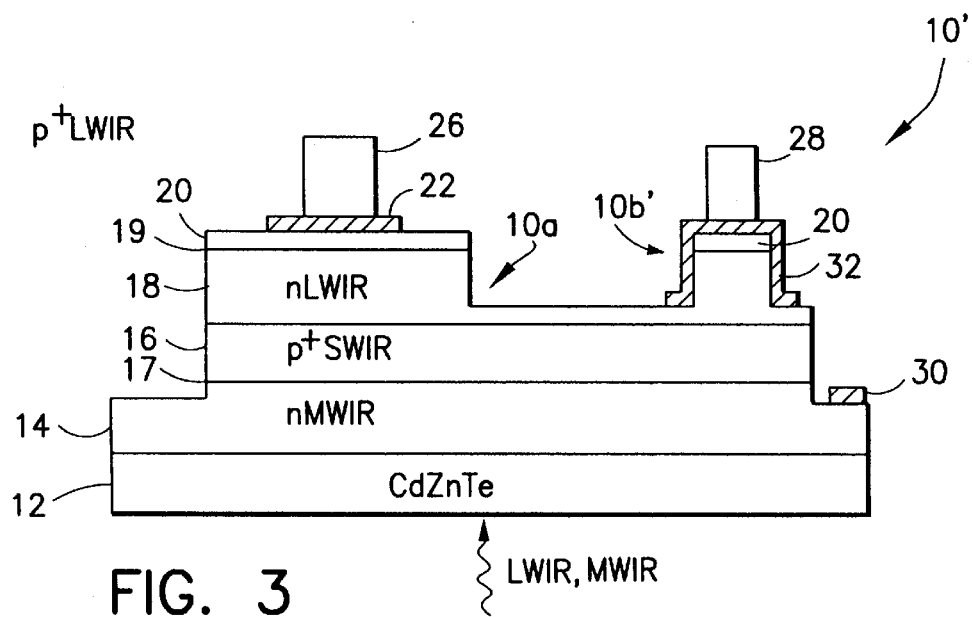
FIG. 3 is a cross-sectional view, not to scale, of a two-color simultaneous IR detector array having, in accordance with a second embodiment of this invention, a four layered structure (n-type MWIR/p$^+$-type SWIR/n-type LWIR with a p$^+$-type LWIR capping layer) that employs, within each pixel, an indirect middle layer (SWIR) contact through an n-LWIR/p-SWIR forward biased diode.

Reference is now made to FIG. 3 for showing a second, indirect middle contact two-color detector 10' embodiment of this invention. Contrasting FIG. 3 with FIG. 2 it can be seen that the aperture 46 and p+ SWIR/n LWIR shorting contact metal 24 is replaced by contact metal 32 which completely envelopes the smaller mesa 10b'. As such, direct metal contact is made only to the n-type LWIR layer 18, and not to the p+ SWIR layer 16. In all other aspects the detector 10' is substantially identical to the detector 10 of FIG. 2.

Figure 8:
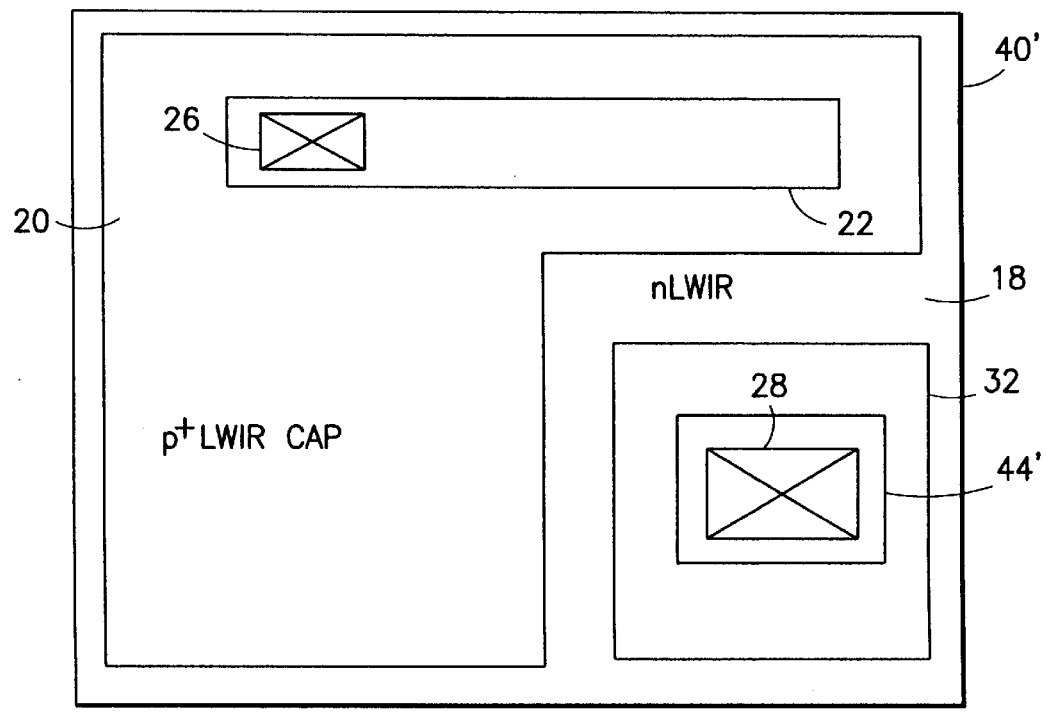
FIG. 8 is an enlarged plan view of the two-color indirect contact detector of FIG. 3.

FIG. 8 is a plan view for the indirect middle layer contact unit cell 40' of FIG. 3. As is evident, the entire mesa top 44' of mesa 10b' is covered by the contact metal 32, which is further conductively coupled to the n-type LWIR layer 18 around the periphery of the mesa 10b'. Also, a larger percentage of the unit cell is comprised of the LWIR diode (p+ LWIR cap layer 20 and underlying n-type LWIR layer 18) than in the direct contact embodiment of FIG. 7.

Figure 6B:
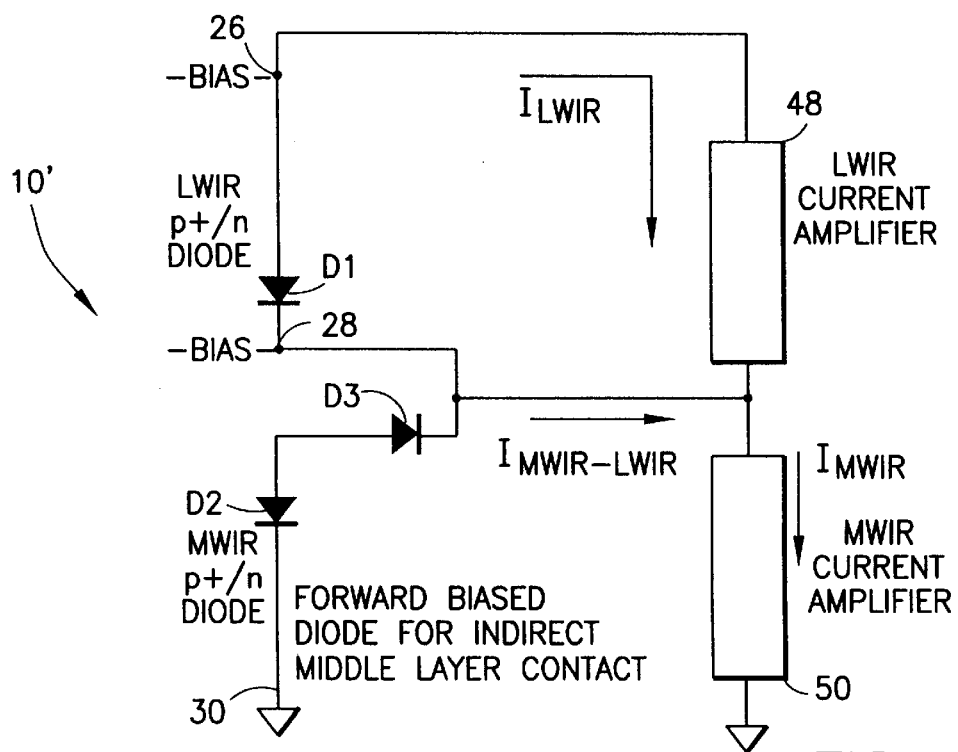
FIG. 6b is a schematic diagram for the n-type MWIR/p$^+$-type SWIR/n-type LWIR/p$^+$-type LWIR capping layer indirect contact detector of FIG. 3.

Referring to FIG. 6b, this indirect contact embodiment forms two series coupled photodetectors within each unit cell, i.e., a p+/n LWIR diode detector D1 and a "sequential readout-like" LWIR/MWIR back-to-back (i.e., anode-to-anode) diode detector comprised of D2 and D3.

FIG. 9 illustrates a top view of a portion of an array 41 of IR detectors comprised of the units cells 40 of FIG. 7 or the unit cells 40' of FIG. 8. As was stated previously, the pitch between adjacent unit cells may be 50 micrometers.

Under normal two-color operation the "sequential like" detector is operated only as a MWIR detector, with the LWIR junction of D3 always forward biased and the MWIR junction of D2 reverse biased. Reverse biasing the MWIR junction of D2 eliminates an undesirable bipolar gain that can occur with sequential two-color detectors. The forward biased LWIR junction of D3 provides the "indirect" contact to the p+ SWIR layer 16. Suitable bias potentials are zero volts for contact 30, −50 mV for contact 28, and −100 mV for contact 26.

However, and in accordance with a further aspect of this invention, by adjusting the bias potentials so as to reverse bias the LWIR junction of D2 and forward bias the MWIR junction of D3, a high optical fill factor, single-color LWIR detector is achieved. Suitable bias potentials are zero volts for contact 30, +50 mV for contact 28, and zero volts for contact 26.

A detector array constructed and operated in this manner thus has two bias-adjustable modes, i.e., a simultaneous two-color (MWIR/LWIR) detector having a first LWIR fill factor and a one color (LWIR) detector with second, higher LWIR fill factor.

Although described in the context of a MWIR/LWIR radiation responsive device, it should be realized that the detector 10 can be constructed to be responsive to other combinations of wavelength bands, such as SWIR/MWIR, SWIR/LWIR, or MWIR/VLWIR. The arrangement of the radiation absorbing layers in these alternate embodiments is such that the incident radiation first encounters the wider bandgap semiconductor material. Furthermore, in these alternate embodiments the material of the substrate 12 is selected so as to be substantially transparent to the wavelength bands of interest. Also, the substrate 12 can be comprised of a material other than a Group II–VI material (CdZnTe). For example, the substrate 12 can be comprised of a Group IV material, such as Si, or a Group III–V material, such as GaAs.

Furthermore, it should be realized that the various material types, dimensions, and thicknesses are exemplary, and should not be read in a limiting sense upon the practice of the teaching of this invention. Also, the conductivity types of the various layers can be reversed and the bias potentials adjusted accordingly.

Also, it is within the scope of this invention to apply an antireflection coating to the radiation receiving surface of the array. In this regard it is also within the scope of this invention to provide each unit cell of pixel with one or more microlens elements within, upon, or over the radiation receiving surface for concentrating incident wavelengths of interest within their respective radiation absorbing layers.

Thus, while the invention has been particularly shown and described with respect to preferred embodiments thereof, it will be understood by those skilled in the art that changes in form and details may be made therein without departing from the scope and spirit of the invention.

What is claimed is:

1. An array comprised of a plurality of radiation detectors, individual ones of said radiation detectors comprising:

a first photoresponsive diode having an anode and a cathode, said cathode being coupled to an anode of a second photoresponsive diode, said first photoresponsive diode being responsive to electromagnetic radiation within a first predetermined band of wavelengths and said second photoresponsive diode being responsive to electromagnetic radiation within a second predetermined band of wavelengths;

a first electrical contact that is conductively coupled to said anode of said first photoresponsive diode;

a second electrical contact that is conductively coupled to said cathode of said first photoresponsive diode and to said anode of said second photoresponsive diode; and a third electrical contact that is conductively coupled to a cathode of each second photoresponsive diode of said array, wherein said first, second and third electrical contacts are coupled during operation of said array to first, second and third potentials, respectively, and wherein said first electrical contact conducts a first electrical current induced by electromagnetic radiation within said first predetermined band of wavelengths, and said second electrical contact conducts a second electrical current induced by electromagnetic radiation within said second predetermined band of wavelengths less an electrical current induced by electromagnetic radiation within said first predetermined band of wavelengths.

2. An array as set forth in claim 1 wherein said second electrical contact is conductively coupled to said cathode of said first photoresponsive diode and to a cathode of a diode having an anode coupled to said anode of said second photoresponsive photodiode.

3. An array comprised of a plurality of radiation detectors, individual ones of said radiation detectors comprising:

a first photoresponsive diode having an anode and a cathode, said cathode being coupled to an anode of a second photoresponsive diode, said first photoresponsive diode being responsive to electromagnetic radiation within a first predetermined band of wavelengths and said second photoresponsive diode being responsive to electromagnetic radiation within a second predetermined band of wavelengths;

a first electrical contact that is conductively coupled to said anode of said first photoresponsive diode;

a second electrical contact that is conductively coupled to said cathode of said first photoresponsive diode and to a cathode of a diode having an anode coupled to said anode of said second photoresponsive photodiode;

a third electrical contact that is conductively coupled to a cathode of each second photoresponsive diode of said array, wherein said first, second and third electrical contacts are coupled during operation of said array to first, second and third potentials, respectively, wherein for first values of said first, second and third potentials said first electrical contact conducts a first electrical current induced by electromagnetic radiation within said first predetermined band of wavelengths, and said second electrical contact conducts a second electrical current induced by electromagnetic radiation within said second predetermined band of wavelengths less an electrical current induced by electromagnetic radiation within said first predetermined band of wavelengths, and wherein for second values of said first, second and third potentials said first electrical contact conducts said first electrical current induced by electromagnetic radiation within said first predetermined band of wavelengths, and said second electrical contact conducts an electrical current induced by electromagnetic radiation only within said first predetermined band of wavelengths.

4. An array comprised of a plurality of radiation detectors, individual ones of said radiation detectors comprising:

a first layer comprised of Group II–VI semiconductor material, said first layer having a first type of electrical conductivity and a bandgap selected for absorbing radiation within a first spectral band;

a second layer overlying said first layer, said second layer being comprised of Group II–VI semiconductor material, said second layer having a second type of electrical conductivity that is opposite the first type of electrical conductivity for forming a first p-n junction photo-responsive diode with said first layer;

a third layer overlying said second layer, said third layer being comprised of Group II–VI semiconductor material, said third layer having the first type of electrical conductivity and a bandgap selected for absorbing radiation within a second spectral band; and a fourth layer overlying said third layer, said fourth layer being comprised of Group II–VI semiconductor material, said fourth layer having the second type of electrical conductivity for forming a second p-n junction photo-responsive diode with said third layer;

wherein said second and third layers are conductively coupled together with an ohmic connection made through an aperture within the third layer for coupling said second and third layers to a first bias supply that, in combination with a second bias supply coupled to said fourth layer, reverse biases both said first and second p-n junction photoresponsive diodes enabling simultaneous collection of photocarriers induced by incident radiation within said first and second spectral bands.

5. An array of radiation detectors as set forth in claim 4, wherein said first and second spectral bands are selected from the group consisting essentially of Short Wavelength Infrared (SWIR) radiation, Medium Wavelength Infrared (MWIR) radiation, Long Wavelength Infrared (LWIR) radiation, and Very Long Wavelength Infrared (VLWIR) radiation.

6. An array of radiation detectors as set forth in claim 4, and further comprising a substrate having a first surface underlying a surface of said first layer, said substrate being selected from a material that is substantially transparent to electromagnetic radiation within said first and said second spectral bands.

7. An array comprised of a plurality of radiation detectors, individual ones of said radiation detectors comprising:

a first layer comprised of Group II–VI semiconductor material, said first layer having a first type of electrical conductivity and a bandgap selected for absorbing radiation within a first spectral band;

a second layer overlying said first layer, said second layer being comprised of Group II–VI semiconductor material, said second layer having a second type of electrical conductivity that is opposite the first type of electrical conductivity for forming a first p-n junction photo-responsive diode with said first layer;

a third layer overlying said second layer, said third layer being comprised of Group II–VI semiconductor material, said third layer having the first type of electrical conductivity and a bandgap selected for absorbing radiation within a second spectral band; and a fourth layer overlying said third layer, said fourth layer being comprised of Group II–VI semiconductor material, said fourth layer having the second type of electrical conductivity for forming a second p-n junction photo-responsive diode with said third layer;

wherein said second and third layers are conductively coupled together with a diode comprised of a portion of said second and third layers, said diode being forward biased by a first bias potential that, in combination with a second bias potential coupled to said fourth layer, reverse biases both said first and second p-n junction photoresponsive diodes enabling simultaneous collection of photocarriers induced by incident radiation within said first and second spectral bands.

8. An array of radiation detectors as set forth in claim 7, wherein said first and second spectral bands are selected from the group consisting essentially of Short Wavelength Infrared (SWIR) radiation, Medium Wavelength Infrared (MWIR) radiation, Long Wavelength Infrared (LWIR) radiation, and Very Long Wavelength Infrared (VLWIR) radiation.

9. An array of radiation detectors as set forth in claim 7, and further comprising a substrate having a first surface underlying a surface of said first layer, said substrate being selected from a material that is substantially transparent to electromagnetic radiation within said first and said second spectral bands.

10. A radiation responsive structure comprised of a plurality of radiation detectors, individual ones of said radiation detectors comprising:

a plurality of serially coupled photoresponsive diodes a first one of which is responsive to electromagnetic radiation within a first predetermined band of wavelengths and a second one of which is responsive to electromagnetic radiation within a second predetermined band of wavelengths, a cathode of said first photoresponsive diode being coupled to an anode of said second photoresponsive diode; and a plurality of electrical terminals coupled to said plurality of serially coupled photoresponsive diodes for coupling said plurality of serially coupled photoresponsive diodes to first, second and third bias potentials, one of said plurality of electrical terminals being coupled to said cathode of said first photoresponsive diode and also to said anode of said second photoresponsive diode, wherein for first values of said first, second and third bias potentials said radiation detector outputs current signals induced by electromagnetic radiation within said first predetermined band of wavelengths and also within said second predetermined band of wavelengths, and wherein for second values of said first, second and third bias potentials said radiation detector outputs a current signal induced by electromagnetic radiation within only said first predetermined band of wavelengths.

11. A structure as set forth in claim 10, wherein said first and second predetermined bands of wavelengths are selected from the group consisting essentially of Short Wavelength Infrared (SWIR) radiation, Medium Wavelength Infrared (MWIR) radiation, Long Wavelength Infrared (LWIR) radiation, and Very Long Wavelength Infrared (VLWIR) radiation.

12. A structure as in claim 10, wherein said structure is located in a unit cell of an array of unit cells, and wherein each of said unit cells has two electrically conductive bumps coupled to two of said electrical terminals for coupling said unit cell to external circuitry.

* * * * *